(12) United States Patent
Cho et al.

(10) Patent No.: US 8,542,425 B2
(45) Date of Patent: Sep. 24, 2013

(54) WAVELENGTH TUNABLE LIGHT SOURCE

(75) Inventors: Seung-Hyun Cho, Daejeon (KR); Jong Hoon Lee, Daejeon (KR); Eun Gu Lee, Daejeon (KR); Jie Hyun Lee, Daejeon (KR); Han-Hyub Lee, Daejeon (KR); Eui Suk Jung, Daejeon (KR); Sang Soo Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 56 days.

(21) Appl. No.: 12/971,233

(22) Filed: Dec. 17, 2010

(65) Prior Publication Data

US 2011/0149365 A1 Jun. 23, 2011

(30) Foreign Application Priority Data

Dec. 18, 2009 (KR) .................. 10-2009-0127088

(51) Int. Cl.
*G02F 1/03* (2006.01)
(52) U.S. Cl.
USPC ........................................... 359/245
(58) Field of Classification Search
USPC .................... 359/245–248; 372/20
See application file for complete search history.

(56) References Cited

U.S. PATENT DOCUMENTS

| 6,646,789 | B2* | 11/2003 | Kelkar et al. | 359/337.1 |
| 6,807,342 | B2* | 10/2004 | Fan | 385/39 |
| 7,002,697 | B2* | 2/2006 | Domash et al. | 356/519 |
| 7,009,750 | B1* | 3/2006 | Westfall et al. | 359/240 |
| 2003/0174952 | A1 | 9/2003 | Fan | |
| 2004/0228384 | A1 | 11/2004 | Oh et al. | |
| 2008/0144032 | A1 | 6/2008 | Miyamae | |
| 2010/0119231 | A1 | 5/2010 | Kim et al. | |
| 2010/0208756 | A1 | 8/2010 | Noh | |
| 2012/0099611 | A1* | 4/2012 | Kim et al. | 372/20 |

FOREIGN PATENT DOCUMENTS

| JP | 2008-152006 A | 7/2008 |
| KR | 2001-0062972 A | 7/2001 |
| KR | 10-0328291 | 7/2002 |
| KR | 2004-0098421 A | 11/2004 |
| KR | 2008-0052319 A | 6/2008 |
| KR | 10-0860558 A | 9/2008 |
| KR | 10-0910979 A | 8/2009 |
| WO | WO-00/04613 A1 | 1/2000 |

OTHER PUBLICATIONS

Geon Jeong et al., "Over 26-nm Wavelength Tunable External Cavity Laser Based on Polymer Waveguide Platforms for WDM Access Networks", IEEE Photonics Technology Letters, vol. 18, No. 20, Oct. 15, 2006, pp. 2102-2104.

* cited by examiner

*Primary Examiner* — Tuyen Tra
(74) *Attorney, Agent, or Firm* — Rabin & Berdo, P.C.

(57) ABSTRACT

A wavelength tunable light source includes: an optical gain medium generating light; a wavelength tunable filter positioned on a optical path and transmitting or reflecting only a predetermined wavelength generated from and injected into the optical gain medium; a first housing where the optical gain medium and the wavelength tunable filter are mounted; and an optical fiber block providing the optical wave having the predetermined wavelength come from the wavelength tunable filter, wherein the wavelength tunable filter comprised of a dielectric thin-film filter formed by alternately stacking a first dielectric thin film layer and a second dielectric thin film layer having different refractive index.

17 Claims, 11 Drawing Sheets

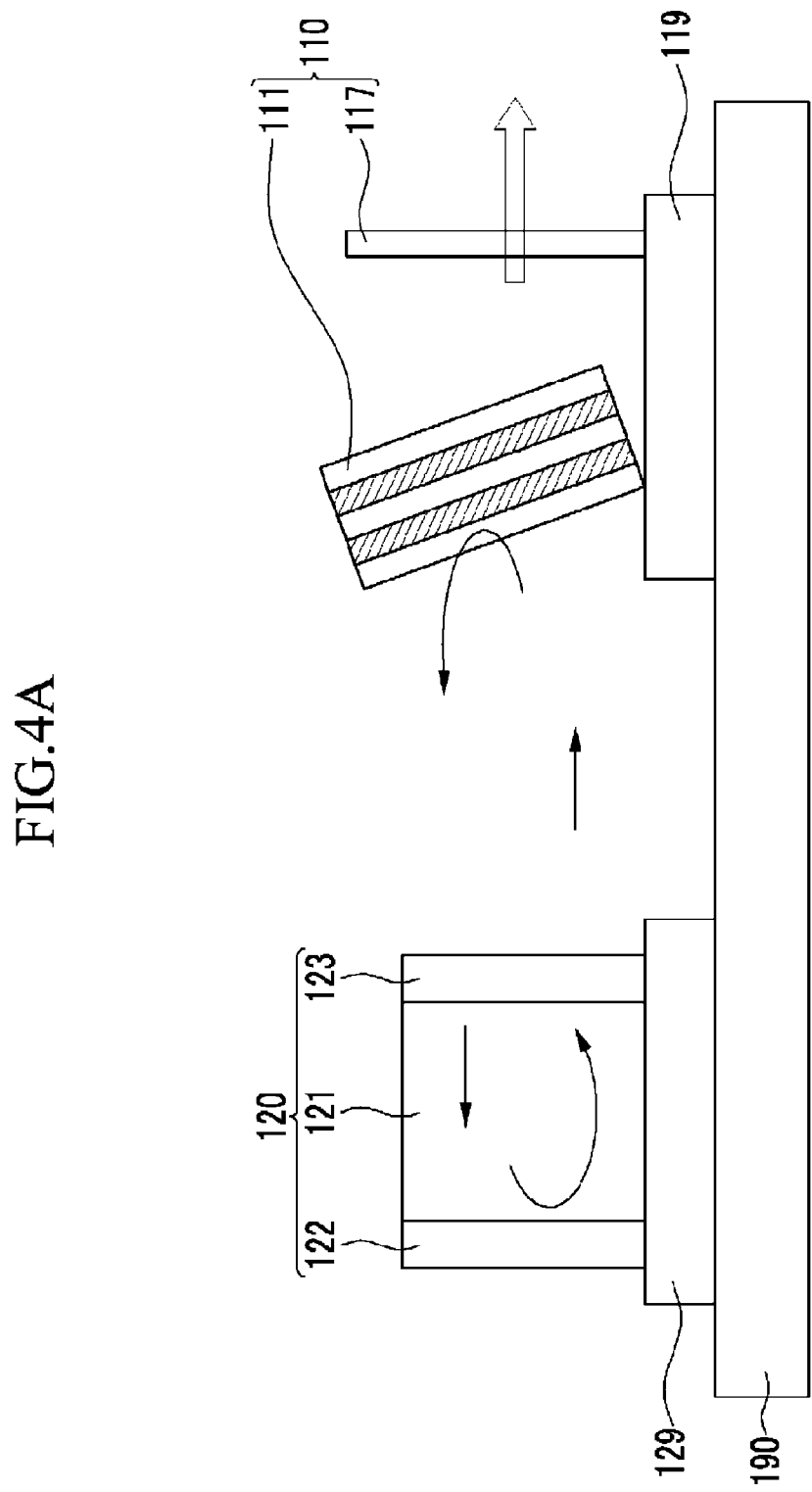

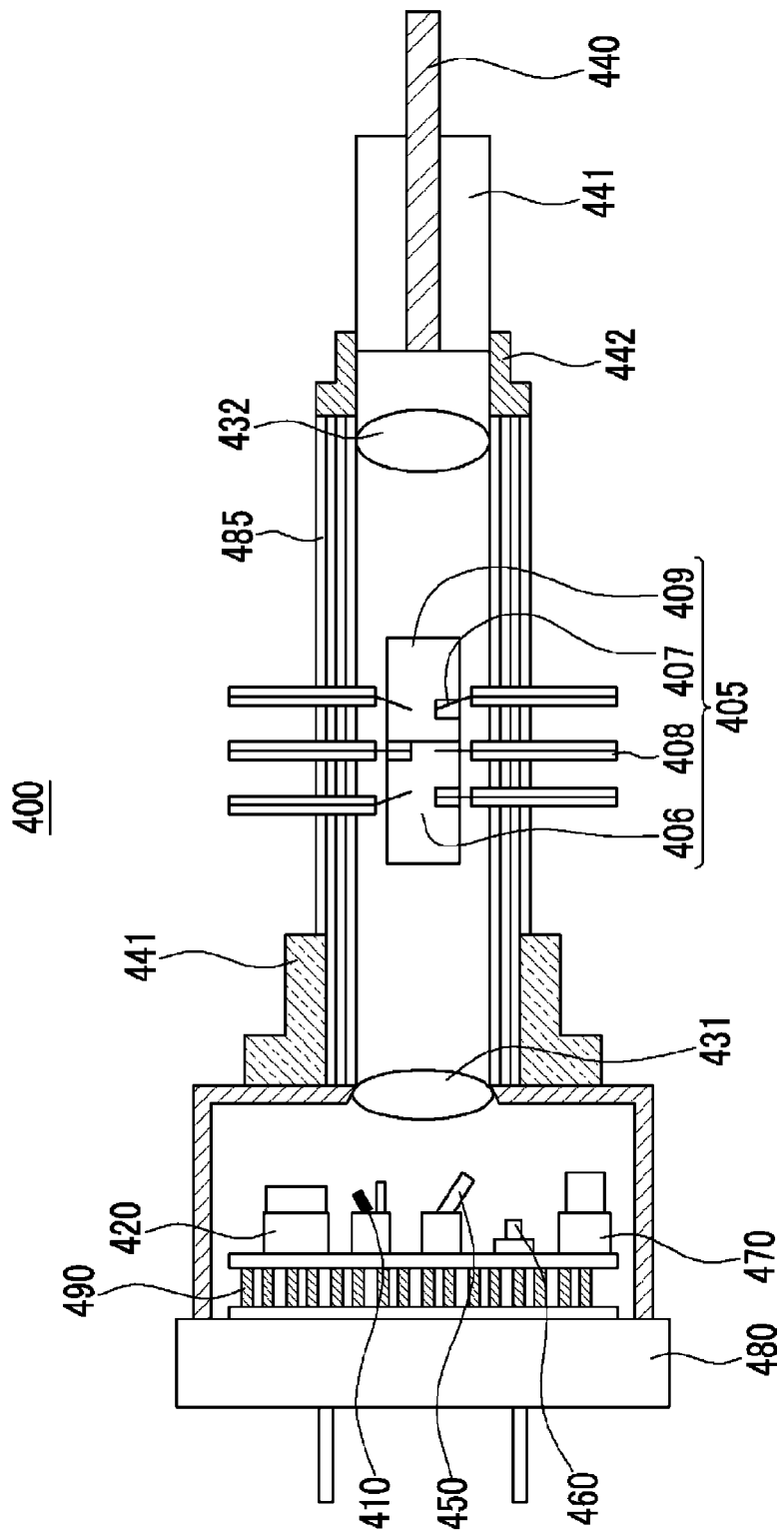

WAVELENGTH TUNABLE LIGHT SOURCE

CROSS-REFERENCE TO RELATED APPLICATION

This application claims priority to and the benefit of Korean Patent Application No. 10-2009-0127088 filed in the Korean Intellectual Property Office on Dec. 18, 2009, the entire contents of which are incorporated herein by reference.

BACKGROUND OF THE INVENTION (a) Field of the Invention

The present invention relates to a wavelength tunable light source, and more particularly, to a wavelength tunable light source capable of tuning a rapid wavelength and improving stability of an output wavelength.

(b) Description of the Related Art

Research and development on a wavelength division multiplexing (WDM) based passive optical network (PON) for providing voice, data, and broadcast converging service that will be largely activated within several years are in progress all over the world. Hereinafter, the wavelength division multiplexing based passive optical network will be referred to as 'WDM-PON'.

The WDM-PON is a scheme in which communication between a center office (CO) and a subscriber is made by using wavelengths allocated to subscribers, respectively. Since an unique wavelength is used for each subscriber, security is excellent, a larger dedicated bandwidth is available irrespective of protocols.

However, since the WDM-PON is a technology that transmits a signal to each subscriber by multiplexing various wavelengths to a single optical fiber by using a WDM technology, the WDM-PON needs different light sources as many as the number of subscribers.lmplementation, installation, and management of the light source for each wavelength operate as a large economical burden to both a user and a network provider are blocking compatibilization of the WDM-PON. In order to solve this problem, wavelength tunable light source capable of selectively change the output-wavelength of a light source is being actively researched.

A typical example of the wavelength tunable light source may include a planar lightwave circuit (PLC) based-external cavity laser (PLC-ECL) in which an optical lens is configured by passively or actively aligning individual optical elements such as a semiconductor laser diode or a reflective semiconductor optical amplifier, a planar lightwave circuit (PLC), and an optical fiber. Hereinafter, the planar lightwave circuit based external cavity laser is referred to as 'PLC-ECL'.

FIG. 8A is a block diagram for each function of a well known PLC-ECL type wavelength tunable light source. Referring to FIG. 8A, the well known PLC-ECL wavelength tunable light source 10 includes a gain region 11, a wavelength tunable region 12, a phase control region 13, and an optical fiber 14.

A reflective semiconductor optical amplifier (RSOA) or a semiconductor laser diode (LD) is used as the gain region 11. A front facet of the RSOA or the semiconductor LD is coated with an anti-reflection layer and a rear facet of the RSOA or the semiconductor LD is coated with a high reflective layer in order to form a resonator. Hereinafter, the RSOA will be used as the gain region 11 for convenience.

The wavelength tunable region 12 is formed by a PLC element and the PLC element includes a WAVEGUIDE, in which a Bragg grating is formed in a partial section of the core region of the waveguide and a thin-film metal heater is disposed adjacent to the diffraction grating. When the RSOA as the gain region 11 and the core layer of the PLC element with the Bragg grating are optically coupled with each other through an active or passive alignment method and thereafter, driving current is applied to the RSOA, an external resonator is formed between the high reflective layer of the rear facet of the RSOA and the Bragg grating in the PLC element and a optical wave having a specific wavelength that coincides with an effective period of the diffraction grating oscillates. Additionally, when an optical output of the PLC element is combined with the optical fiber 14 such as a single-mode optical fiber, etc., it becomes a light source.

In the case of the PLC-ECL wavelength tunable light source 10, the PLC-type lightwave is manufactured by using an organic compound (polymer) having a relatively higher thermooptic coefficient for tuning an resonant wavelength and when current is injected through electrodes at both ends of the thin-film metal heater, heat generated from the thin-film metal heater increases the temperature of the waveguide core layer adjacent thereto. As a result, a refractive index of the waveguide core layer is changed by a thermooptic effect, causing the change of refractive index of the Bragg grating to be shortened so as to tune the emitted optical wavelength of the PLC-ECL.

The thin-film metal heater, both electrodes, and the Bragg-grating is comprised of the wavelength tunable region 12 and the thin-film metal heater and both electrodes that are disposed in parts of the waveguide core layer. The phase control region 13 controls a round trip phase of the emitted light from the PLC-ECL The PLC-ECL based wavelength tunable light source 10 has a simple structure to be easily implemented and has a small number of control parameters to be easily operated and in addition, it can separate key function blocks at the same time and verify them to rapidly and easily correct a defect when individual components have errors. Further, the PLC-ECL based wavelength tunable light source 10 can be implemented costeffectively.

However, since the PLC-ECL based wavelength tunable light source 10 uses the thermooptic effect for tuning the wavelength, a power consumption for this is relatively larger and when a polymer waveguide is used as a wavelength tunable filter, a heat transfer characteristic of the polymer itself is not good for varying ambient temperature, thus, the stability of a tunable wavelength is severely degraded. In addition, as the wavelength is tuned repetitively, it is difficult to tune the wavelength to be a desired value due to a high fatigue degree characteristic of the polymer material itself.

In addition, since sizes of components constituting the wavelength tunable light source are relatively larger, it is difficult to manufacture a small-sized optical transceiver. A packaging process including optical coupling or component alignment is more complicated than other wavelength tunable light sources, thus, a manufacturing cost may be increased. In addition, slope efficiency of the light source itself is lower than the that of a wavelength tunable light source integrated on a single substrate due to optical coupling.

FIG. 8B shows a known sampled grating distributed Bragg reflector (SG-DBR) laser diode complementing the disadvantages of the above-mentioned PLC-ECL based wavelength tunable light source 10. The well known SG-DBR laser diode 20 includes two SG-DBR regions 21 and 24, a gain region 22, and a phase control region 23. In addition, the SG-DBR laser diode 20 further needs external control circuits such as a Vernier control circuit 27 for continuous wavelength tuning, an offset control circuit 28 for discrete wavelength tuning, a phase control circuit 26 of the phase region and a gain control circuit 25 in order to tune the wavelength of SG-DBR output.

Referring to FIG. 8B, when current is applied to the gain region 22, an optical wave distributed throughout a wide wavelength is generated by self emission. In the case of the optical wave, only an optical wave having a predetermined wavelength can be resonated in the laser diode by SG-DBR regions at both ends to cause the laser diode to oscillate at the wavelength.

A sampled grating structure is formed in the SG-DBR regions 21 and 24. Only the optical wave corresponding to the predetermined wavelength is reflected by the sampled grating. A wavelength of a center peak on a reflection spectrum is a Bragg wavelength determined by a diffraction grating period and an interval between wavelengths each having a peak is determined by period of sampled gratings. That is, SG-DBR regions of sampled gratings having different periods are integrated on both terminals of the laser diode, such that the laser diode has oscillationb characteristics at a predetermined wavelength having matching peaks among peaks of the reflection spectrum of the SG-DBR region.

In addition, when a refractive index of the SG-DBR region is changed by current, etc., each peak of the reflection spectrum moves while maintaining an interval between the wavelengths. Wavelengths of the matching reflection peaks are changed due to movement of the reflection peak so as to tune the oscillation wavelength.

The phase control region 23 serves to maximize the power of the oscillating wavelength by matching a longitudinal mode with continuous wavelength tuning or the reflection peak by adjusting an interval between longitudinal modes of the gain region 22 generated by the SG-DBR region. According to such a principle, continuous/discrete wavelength tuning is possible by properly adjusting refractive indices of the SG-DBR regions 21 and 24 at both ends and the phase control region 23 by using current.

However, the SG-DBR laser diode has a structural limit in which since the refractive indices of the SG-DBR regions at both ends and the refractive index of the phase region should be changed for tuning the wavelength, an external circuit for controlling the elements is complicated and optical coupling efficiency is decreased due to a loss generated in the SG-DBR regions integrated on both ends for tuning the wavelength.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a wavelength tunable light source having advantages of acquiring wide and rapid wavelength tunable characteristics with low power consumption and providing the larger modulation bandwidth up to a few Gbps.

An exemplary embodiment of the present invention provides a wavelength tunable light source that includes: an optical gain medium generating optical waves; a wavelength tunable filter positioned on optical path and transmitting or reflecting only a predetermined wavelength generated from and injected into the optical gain medium; a first housing where the optical gain medium and the wavelength tunable filter are mounted; and an optical fiber block providing the optical wave having the predetermined wavelength come from the wavelength tunable filter, wherein the wavelength tunable filter includes a dielectric thin-film filter formed by alternately stacking a first dielectric thin film layer and a second dielectric thin film layer having different refractive index.

The first dielectric thin film layer and the second dielectric thin film layer may also have different thermooptic coefficients, and the first dielectric thin film may be made of an amorphous silicon based material which is hydrogenated and the second dielectric thin film layer may be made of a silicon nitroxide based material or a silicon nitride based material.

The wavelength tunable filter may further include a reflection plate reflecting the optical wave transmitted through the dielectric thin-film filter on the optical gain medium. At this time, the dielectric thin-film filter is placed with a typical angle along the incident direction of the optical wave injected into the wavelength tunable filter and the reflection plate is a reflective thin film layer having predetermined reflectance.

The optical gain medium is composed of reflective semiconductor optical amplifier or a semiconductor laser diode and integrated with an electro absorption modulator for high speed modulation, and the reflectance of a front emission surface may be 0.1% or less and the reflectance of a rear emission surface may be 90% or more.

The wavelength tunable light source according to the exemplary embodiment of the present invention may further include an lens for optical coupling supported by the first housing, and positioned on the optical path of the optical wave, which is transmitted through the wavelength tunable filter or reflected from the wavelength tunable filter to the optical fiber.

Further, the wavelength tunable light source may further include a thermistor and a thermo-electric cooler that are mounted on the first housing coincidentally, wherein the optical gain medium, the wavelength tunable filter, and the thermistor are placed on the thermo-electric cooler. In addition, the wavelength tunable light source may further include an optical wave distributor with mirror mounted in the first housing and changing an direction of an optical wave having a predetermined wavelength transmitted through the wavelength tunable filter or reflected from the wavelength tunable filter; and an optical detector mounted in the first housing and monitoring the performance of the light source by detecting the partial optical wave optical wave distributor with mirror.

The wavelength tunable light source according to the exemplary embodiment of the present invention may further include an external modulator between the first housing and the optical fiber.

The external modulator may be an electroabsorption modulator and may be formed by integrating the electroabsorption modulator and the reflective semiconductor optical amplifier on a single substrate.

The wavelength tunable light source may further include a second housing where the external modulator is mounted; and an optical fiber ferrule where the optical fiber is mounted. At this time, the first housing may be formed by a transistor outlined package and the second housing may be formed by a box-type package.

Further, the wavelength tunable light source may further include a first lens for providing the optical coupling means between the optical gain medium and the wavelength tunable filter and a second lens for optically coupling the external modulator and the optical fiber.

BRIEF DESCRIPTION OF THE DRAWINGS

FIGS. 4A to 4D are diagrams show operating principles of an optical gain medium and a wavelength tunable filter according to a first embodiment and a modified example of the present invention;

FIG. 7 shows a cross-sectional view of a wavelength tunable light source according to a fourth embodiment of the present invention.

DETAILED DESCRIPTION OF THE EMBODIMENTS

Figure 1:
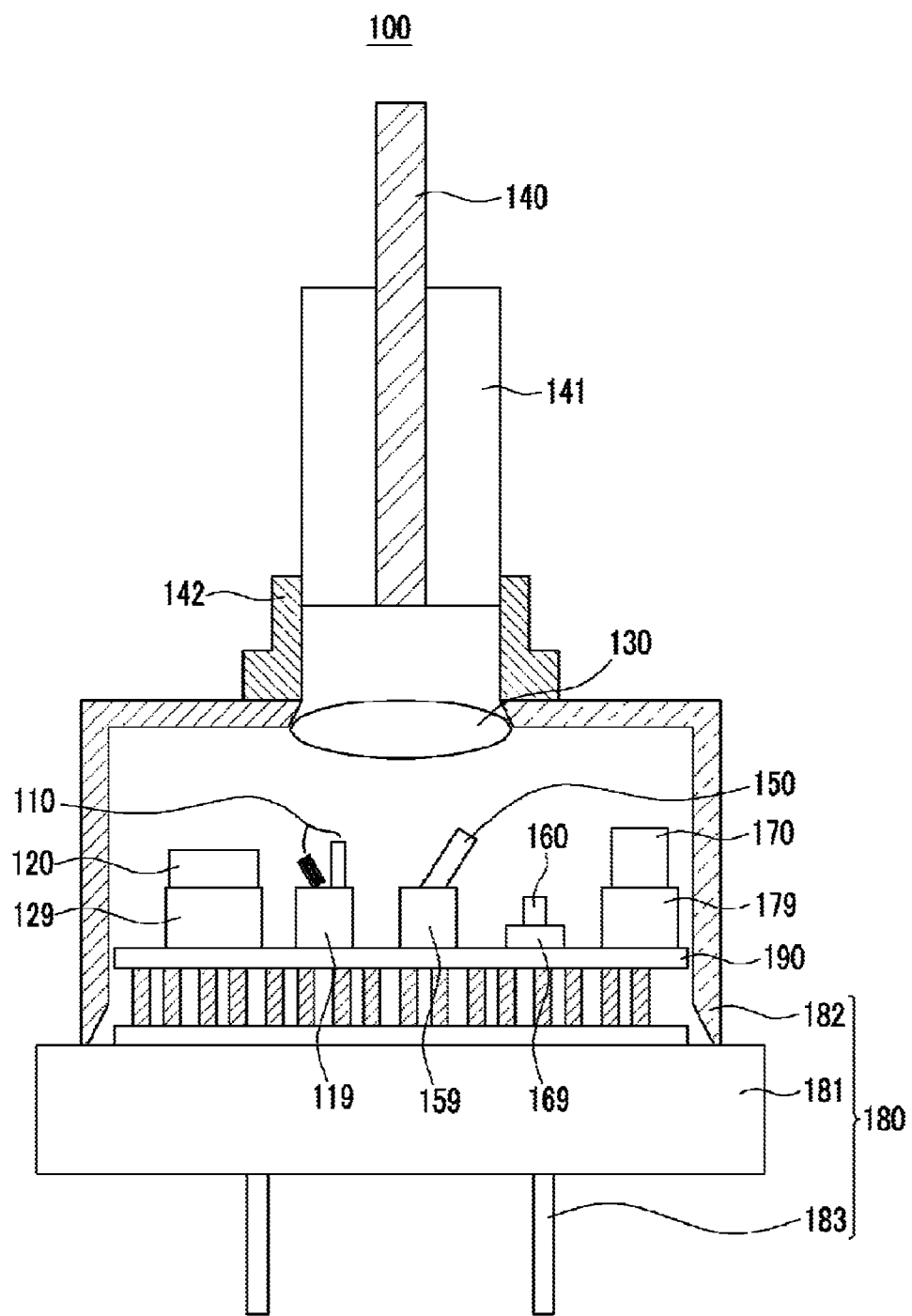
FIG. 1 shows the cross-sectional view of a wavelength tunable light source according to a first embodiment of the present invention.

In the following detailed description, only certain exemplary embodiments of the present invention have been shown and described, simply by way of illustration.

The drawings and description are to be regarded as illustrative in nature and not restrictive. Like reference numerals designate like elements throughout the specification. In addition, the size and thickness of each component shown in the drawings are arbitrarily shown for understanding and ease of description, but the present invention is not limited thereto.

FIG. 1 shows a cross-sectional view of a wavelength tunable light source according to a first embodiment of the present invention. Referring to FIG. 1, the wavelength tunable light source 100 according to the first embodiment of the present invention includes a wavelength tunable filter 110, an optical gain medium 120, an optical lens for coupling 130, and an optical fiber 140.

The wavelength tunable light source 100 produces an optical wave corresponding to a predetermined wavelength by using the optical gain medium 120 and the wavelength tunable filter 110 and provides it to the outside by using the optical lens 130 and the optical fiber 140.

The wavelength tunable light source 100 may further includes a thermoelectric cooler 190 and a thermistor 170. Further, the wavelength tunable light source 100 may further include an optical wave distributor with mirror 150 changing the direction of the oscillated optical wave in the resonator and an photodetector 160. In the wavelength tunable light source 100, submounts 119, 129, 159, 169, and 179 for placing the components may be located on the thermoelectric cooler 190. The wavelength tunable light source 100 may further include a housing 180 including a cap 182, a base 181, and a lead 183. The above-mentioned devices will be described below.

The wavelength tunable light source 100 uses a dielectric thin-film filter 111 as the wavelength tunable filter 110, which will be described with reference to FIGS. 3 to 4C.

Figure 2:
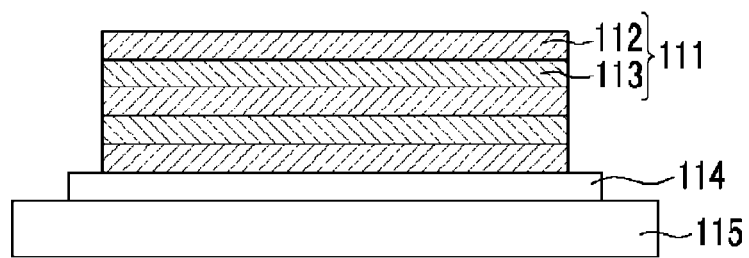
FIG. 2 shows a structure of a dielectric thin-film filter.
Figure 3A:
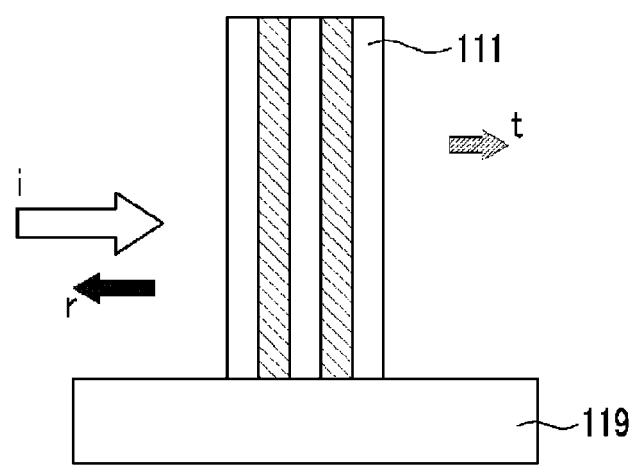
FIGS. 3A to 3C are diagrams show an operating principle of a wavelength tunable filter according to a first embodiment of the present invention.
Figure 3B:
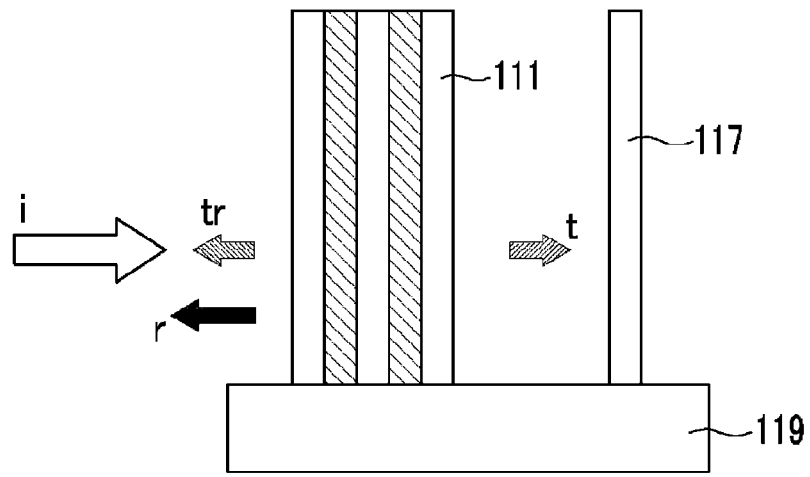
Figure 3C:
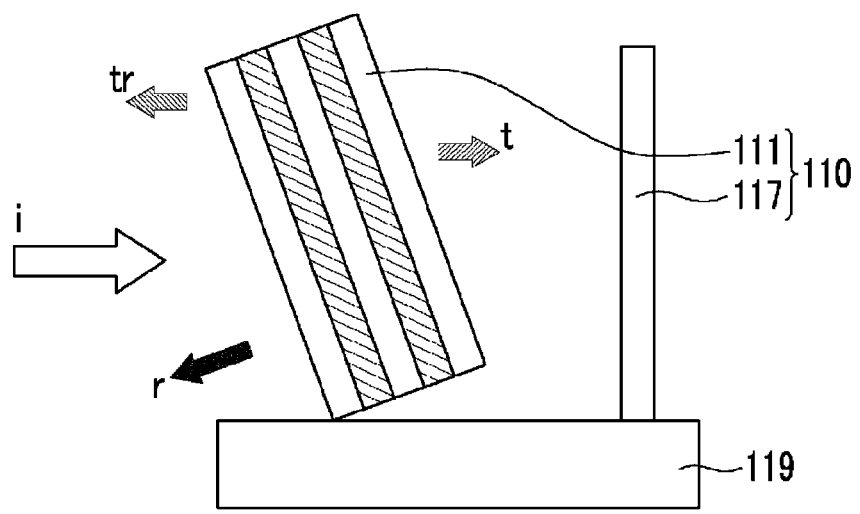

FIG. 2 is a schematic diagram showing a dielectric thin-film filter used as a wavelength tunable filter in a wavelength tunable light source according to a first embodiment of the present invention and FIGS. 3A to 3C show an operating principle of a wavelength tunable filter according to a first embodiment of the present invention.

Referring to FIG. 2, the dielectric thin-film filter 111 includes a first dielectric thin film 112 and a second dielectric thin film 113. A heater 114 and a transparent substrate 115 are placed on single surface of the dielectric thin-film filter 111.

According to the embodiment of the present invention, the first dielectric thin film 112 and the second dielectric thin film 113 of the dielectric thin-film filter 111 are made of materials having different refractive index. The first and second dielectric thin films 112 and 113 are alternately stacked. Specifically, the first dielectric thin film 112 and the second dielectric thin film 113 having different refractive index are alternately stacked with a thickness corresponding to ¼ of an incident wavelength $\lambda$.

At this time, the wavelength is transmitted through the dielectric thin-film filter 111 may be changed by varying the refractive index of each thin film by applying heat. At this time, the thin film layer having the relatively higher refractive index is made up of an amorphous silicon based material with a larger thermooptic coefficient similar to polymer and excellent heat transfer characteristic, which is hydrogenated and the other thin film having the relatively lower refractive index may be made up of a silicon nitroxide or silicon nitride based material. Further, the transparent substrate 115 is composed of glass is coated with an zinc dioxide metal thin film or a polycrystalline silicon to be used as a heater 114 in order to control the resonant wavelength caused by the change of the refractive index.

The above-mentioned materials used for the dielectric thin-film filter 111 have the excellent heat transfer characteristic and can improve switching speed required to tune the wavelength. For example, since the polymer has a bad heat transfer characteristic, the required switching speed is 1 s or more, but when the dielectric thin film 111 is made of the amorphous silicon based material, etc., the switching speed can be reduced to approximately several ms.

Referring to FIG. 3A, when the dielectric thin-film filter 111 is placed on the submount 119 and the optical wave is injected (i) along the vertical direction of the dielectric thin-film filter 111, the optical wave including the predetermined wavelength component is transmitted (t) through the dielectric thin-film filter 111, while optical waves having wavelengths other than the predetermined wavelength are reflected (r) from the dielectric thin-film filter 111, due to the above-mentioned characteristics of the dielectric thin-film filter 111.

Meanwhile, an external cavity laser including the wavelength tunable filter and the optical gain medium as key components follows a laser oscillation principle in which as described in the "Description of the Related Art", a resonator is formed by using the wavelength tunable filter and the optical gain medium and self emitted light generated from the optical gain medium acquires a gain larger than resonating loss In order to make tunable external cavity laser, the wavelength tunable filter should reflect the optical wave corresponding to the predetermined wavelength and in addition, one of the mirror consisted of external cavity should have reflectance close to 100% and the other mirror should have reflectance lower than that of the former reflectance However, the dielectric thin-film filter 111 has a characteristic to transmit the optical wave corresponding to the predetermined wavelength. In this case, the dielectric thin-film filter 111 should further include a reflection plate inducing reflection of the optical wave transmitted through the dielectric thin-film filter in order to use the laser oscillation principle.

Referring to FIG. 3B, in the case in which the dielectric thin-film filter 111 and the reflection plate 117 are placed on the submount 119, when the optical wave is injected with a typical angle along the vertical direction to the dielectric thin-film filter 111, the optical wave including the predetermined wavelength is transmitted (t) through the dielectric thin-film filter 111, optical waves having wavelengths other than the predetermined wavelength is reflected (r) from the dielectric thin-film filter 111, and the optical wavelength of the predetermined wavelength that is transmitted through the dielectric thin-film filter 111 and also is reflected (tr) into the incident direction from the reflection plate 117.

However, by combination of the dielectric thin-film filter 111 and the reflection plate 117 shown in FIG. 3B, the optical waves having the wavelengths other than the predetermined wavelength is reflected into the incident direction of the optical wave.

Accordingly, referring to FIG. 3C, the wavelength tunable light source 110 according to the first embodiment of the present invention includes the dielectric thin-film filter 111 and the reflection plate 117. The dielectric thin-film filter 111 is placed with a proper angle to an incident or reflective direction in order to prevent the optical waves having wavelengths other than the predetermined wavelength from being reflected into the incident direction. As a result, the optical waves having the wavelengths other than the predetermined wavelength are reflected (r) with a predetermined angle in the incident direction of the optical wave and thus, only the optical wave including the predetermined wavelength is transmitted (t) through the dielectric thin-film filter 111 and thereafter, reflected (tr) by the reflection plate 117 to be resonated between the forward direction and the reverse direction, thereby using a laser oscillation principle of an external cavity.

Figure 4B:
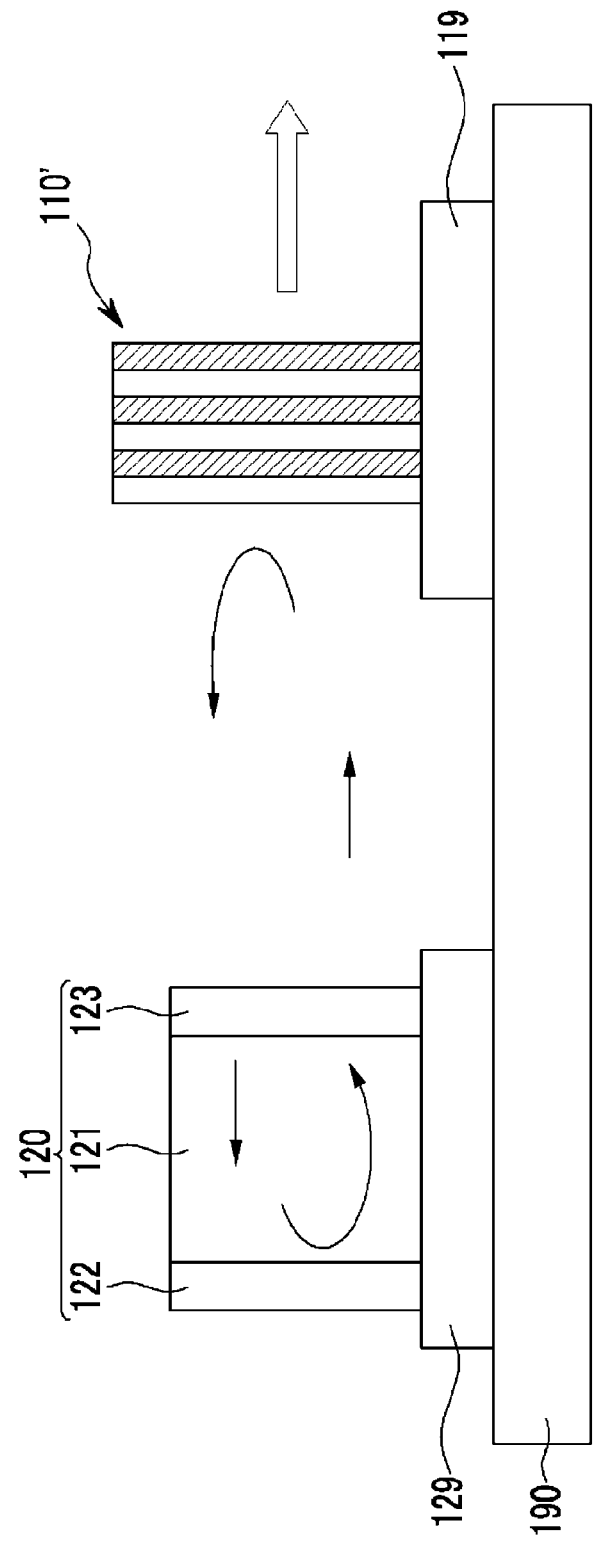

Meanwhile, a reflection-type dielectric thin-film filter (not shown) reflects the optical wave having a predetermined wavelength. Further, the dielectric thin-film filter may be used as a wavelength tunable filter (not shown). FIGS. 4A to 4D show operating principles of tunable light sources according to a first embodiment. Referring to FIG. 4A, the wavelength tunable filter 110 and the optical gain medium 120 according to the first embodiment of the present invention stands face to face on each of the submounts 119 and 129 formed on a basement 190.

In the case of the optical gain medium 120, a reflective semiconductor optical amplifier is used as a gain material and in order to prevent resonance of the light from being generated in the optical gain medium 120 itself, the front facet of gain medium is coated with an anti-reflection layer 123 having reflectance of 0.1% or less and a rear facet is coated with a high-reflective layer 122 having reflectance of 90% or more for resonating the light between the optical gain medium 120 and the wavelength tunable filter 110. A semiconductor laser diode may also be used as the gain medium 121, According to such a structure, the wavelength tunable light source operates in accordance with a principle in which when the emission light generated from the optical gain medium 120 acquires a gain larger than the loss of the resonator is continuously resonated in a forward direction and a reverse direction between the high-reflective layer 122 of the rear facet of the optical gain medium 120 and the reflection plate 117 of the wavelength tunable filter 110, the light is emitted to the outside of the reflection plate 117.

The optical wave that is oscillated is emitted to the outside through an optical coupling unit and the optical fiber. At this time, in the case in which a modulation signal of 2.5 Gbps or less is injected at the same time when current for driving the reflective semiconductor optical amplifier is applied, the wavelength tunable light source is used as a directly modulated wavelength tunable light source. When the predetermined bias current is applied to the wavelength tunable light source 100 according to the first embodiment of the present invention, the wavelength tunable light source 100 is used as a continuous wavelength operated wavelength tunable light source. As the wavelength tunable light source 100 is optically coupled with an external modulator such as an electro-absorption modulator or a Mach-Zehnder interferometer type lithium niobate modulator, the wavelength tunable light source 100 is used as a light source module which can be externally modulated at high speed of 10 Gbps or more. It will be described in detail through another embodiment afterwards.

Meanwhile, in the embodiment, a transmissive filter that is positioned with a predetermined specific angle along the direction of the incident light is used as the dielectric thin-film filter 111 of the wavelength tunable filter 110 and the reflective semiconductor optical amplifier is used as the optical gain medium 120, but the present invention is not limited thereto and may have various modified examples.

Referring to FIG. 4B, in a first modified example, in a configuration in which a wavelength tunable filter 110' and the optical gain medium 121, and the high-reflective layer 122 of the rear facet and the anti-reflection layer 123 of the front facet each other on the submounts 119 and 129 similarly as in FIG. 4A, the wavelength tunable filter 110' may be formed by a reflective type dielectric thin-film filter. That is, the wavelength tunable filter 110' is formed by a reflective filter having reflectance of approximately 50% by adjusting the number of thin films stacked in the dielectric thin-film filter to perform the same role as the wavelength tunable filter 110 of the embodiment. According to the first modified example, since the wavelength tunable filter 110' does not require an additional reflection plate, the wavelength tunable filter 110' can be configured in a simpler structure.

Figure 4C:
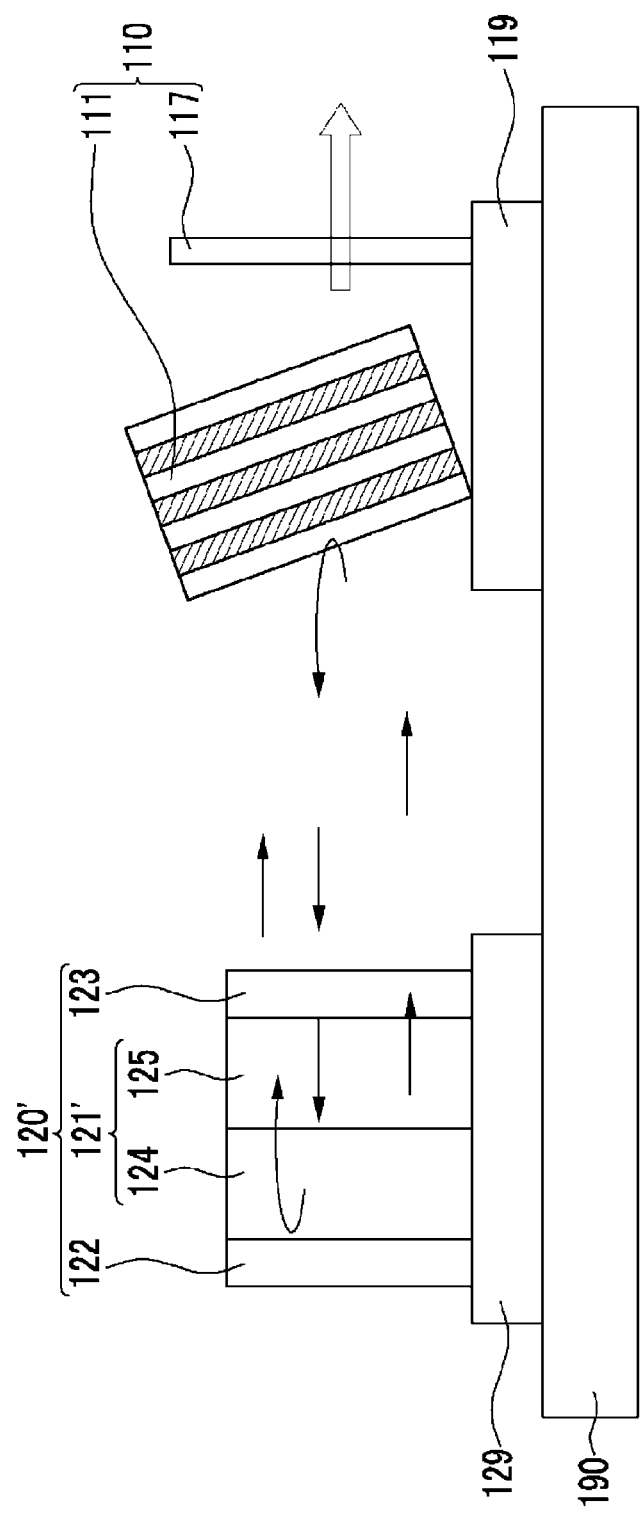

Referring to FIG. 4C, in a second modified example, the wavelength table filter 110 includes a transmissive dielectric thin-film filter 111 and the reflection plate 117 similarly as in FIG. 4A, a front facet of a gain material 121' is coated with the anti-reflection layer 123 of 0.1% or less and a facet of the gain material 121' is coated with the high-reflective layer 122 of 90% or more for resonating the optical wave between the optical gain medium 120' and the wavelength tunable filter 110. At this time, in the optical gain medium 120', the gain material 121' is formed by integrating the reflective semiconductor optical amplifier 125 and the electroabsorption modulator 124.

In such a structure, when the self emission light generated from the reflective semiconductor optical amplifier 125 is injected into the wavelength tunable filter 110 including the reflection plate 117 and if only a predetermined wavelength is selected by the wavelength tunable filter 110 to be reflected to the reflective semiconductor optical amplifier 125, the light can acquire a proper gain depending on an applied current. Thereafter, the self emission light is modulated by a high-speed electrical signal applied from the outside and the modulated optical wave is reflected by the high-reflective layer 122 of the rear facet and again transmitted toward the wavelength tunable filter 110. At this time, when the optical wave acquires a gain larger than a resonator loss, the optical wave oscillates and the oscillated optical wave is emitted to the outside through the optical coupling unit and the optical fiber.

According to the configuration of the second modified example, the optical wave can serve as a light source which can be modulated at high speed.

Figure 4D:
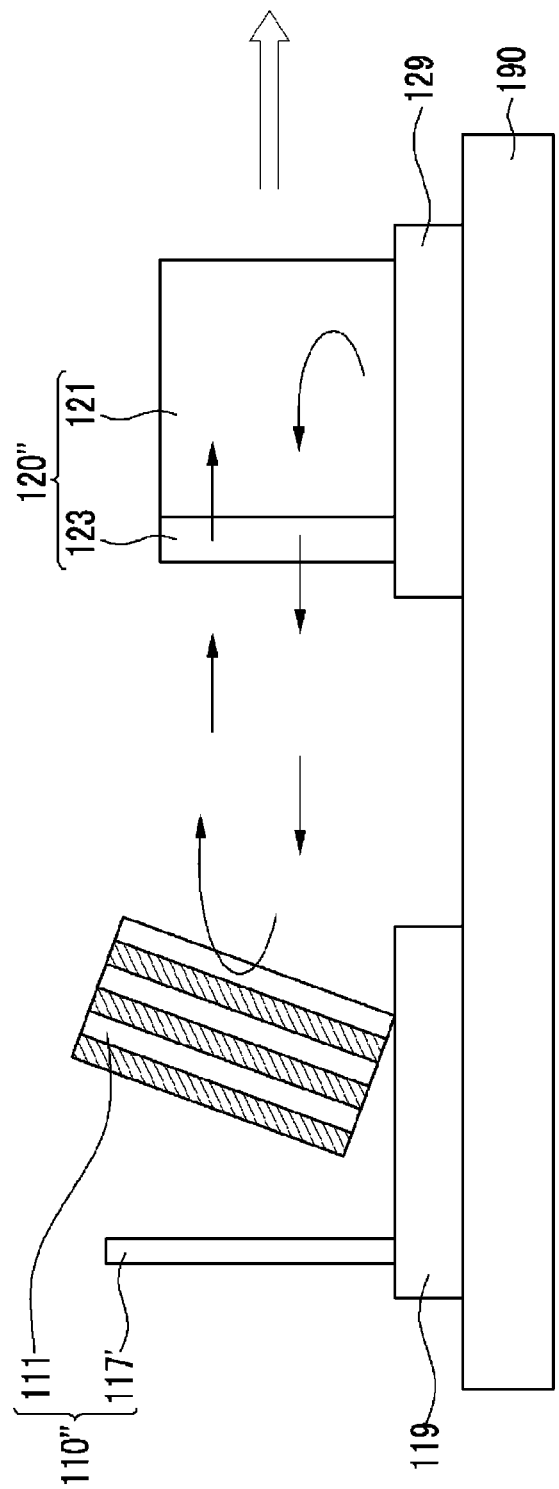

Referring to FIG. 4D, in a third modified example, an optical gain medium 120" is disposed at a portion oscillating the optical wave and a wavelength tunable filter 110" is disposed at a portion opposite thereto. At this time, in the optical gain medium 120", the reflective semiconductor optical amplifier is used as the gain material 121, any processing for a reflection characteristic is not performed on the rear facet in the gain material or the rear facet is coated with the high reflection layer at a predetermined ratio and the front facet is coated with the anti-reflection layer 123 in order to provide stable optical wave oscillating operation characteristics. Meanwhile, the wavelength tunable filter 110" includes the dielectric thin-film filter 111 and a reflection plate 117" having high reflectance of 90% or more.

According to the third modified example, the resonator for oscillating the optical wave is formed by using the rear facet of the wavelength tunable filter 110" including the reflection plate 117 having high reflectance and the optical gain medium 120" as the reflection layer and the wavelength tunable light source operates in accordance with a principle in which the self emission light is emitted to the outside when the self emission light generated from the gain material 121 acquires the gain larger than the loss of the resonator.

Besides, it will be easily appreciated to those skilled in the art that various modified examples of the wavelength tunable light source constituted by the wavelength tunable filter including the dielectric thin-film filter and the optical gain medium including the gain material using the reflective semiconductor optical amplifier may exist.

Hereinafter, the rest components constituting the above-mentioned wavelength tunable light source 100 will be described with reference to FIG. 1.

The wavelength tunable light source 100 according to the embodiment of the present invention resonates and oscillates an optical wave corresponding to a predetermined wavelength component by using the optical gain medium 120 and the wavelength tunable filter 110, induces the resonated and oscillated optical wave to the outside by using the optical coupling lens 130 and the optical fiber 140. The optical coupling lens 130 may be formed by an aspherical lens or a ball lens, the optical fiber 140 is fixed by a thermally stable epoxy resin and may be mounted in a metallic optical fiber ferrule 141, and the optical fiber 140 may be bonded to the housing 180 to be described below through a sleeve 142.

The wavelength tunable light source 100 emits the optical waves emitted from the optical gain medium 120 and the wavelength tunable filter 110 in a vertical direction by changing the directions of the optical waves at 90 degrees and further includes the optical wave distributor with a mirror 150 in order to irradiate the optical waves. Referring to FIG. 2, a mirror is disposed at a proper angle to be used as the optical wave distributor 150 with a mirror.

Further, the wavelength tunable light source 100 may further include the optical detector 160. As described above, since a cross section at one side of the optical gain medium 120 is formed by the high-reflective layer 122, direct light detection for checking optical performance of the light source is not easy. However, like the first embodiment of the present invention, when the irradiation direction of the optical wave is changed by using the optical wave distributor with a mirror 150, the optical performance of the light source can be checked by disposing the optical detector 160 at a proper location.

Meanwhile, when current is injected into the reflective semiconductor optical amplifier or the semiconductor laser diode for its operation, heat is generated from the inside of the reflective semiconductor optical amplifier or the semiconductor laser diode, slope efficiency of the light source itself is decreased due to the generated heat, such that output optical power may be decreased as time goes by. Further, when the light source operates under an environment with high temperature, a heat accumulation phenomenon degrades the slop efficiency of light source.

As such, the operation of the wavelength tunable light source depends on temperature and the wavelength tunable light source 100 according to the first embodiment of the present invention may further include a thermistor 170 and a thermo-electric cooler (TEC) 190 in order to be operated in a wide temperature range.

The thermistor 170 is positioned in a right end on the thermo-electric cooler 190 with reference to FIG. 1, but the present invention is not limited thereto and may be disposed at a predetermined location on the thermo-electric cooler 190 used as the basement for detection of the temperature The thermo-electric cooler 190 is used as the basements of all the components constituting the wavelength tunable light source 100 in order to compensate the heat related operation and the components are disposed on the thermo-electric cooler 190 by using the submounts 119, 129, 159, 169, and 179.

The wavelength tunable light source 100 according to the embodiment may further include the housing 180 accommodating the above-mentioned components. In the wavelength tunable light source 100, the housing 180 has a transistor-outlined package (TO). Hereinafter, the transistor outlined package is generally referred to as 'TO' for ease of description. As such, in the case in which the wavelength tunable light source is formed by a TO package, the wavelength tunable light source can be implemented with a low cost.

Referring to FIG. 1, the housing 180 includes a base 181, a cap 182, and a lead 183. The base 181 is positioned below the thermo-electric cooler 190 to serves a heat sink as well as a supporter, thereby improving thermal characteristics of the wavelength tunable light source 100 itself. Meanwhile, a thermo-electric cooler support (not shown) made of copper tungsten (CuW), which is capable of buffering a difference in thermal expansion coefficient between the base 181 and the thermo-electric cooler 190 may be inserted between the base 181 and the thermo-electric cooler 190.

The cap 182 capable of covering the components of the wavelength tunable light source 100 is positioned on the top of the base 181 and the lead 183 for controlling the operations of the components is positioned on the bottom of the base 181. Specifically, the cap 182 supports the optical coupling lens 130 and is bonded with the metallic optical fiber ferrule 141 in which the optical fiber 140 is mounted through the sleeve 142 to emit the optical waves emit from the optical gain medium 120 and the wavelength tunable filter 110. Further, the lead 183 may include an anode and a cathode for controlling the reflective semiconductor optical amplifier of the optical gain medium 120, an anode and a cathode for controlling the thermo-electric cooler 190, an anode and a cathode of the optical detector 160 for monitoring the optical performance for the operation state of the light source, a positive terminal of the thermistor 170, and a positive terminal of an electrode for a heater for wavelength tuning of the wavelength tunable filter 110.

The housing 180 may be made of a stainless-steel material in order to protect and connectoptically, electrically, and physically the comprising components of the wavelength tunable light source 100. Further, the housing 180 prevents performance deterioration of the components positioned in the housing 180 depending on an environmental change through hermetic sealing.

As described above, the wavelength tunable light source 100 according to the embodiment of the present invention may expect rapid wavelength tuning by using the dielectric thin-film filter 111 as the wavelength tunable filter 110 to improve stability in controlling the output wavelength and when the gain material 121' of the optical gain medium 120 is formed by integrating the reflective semiconductor optical amplifier 125 and the electroabsorption modulator 124, the wavelength tunable light source which can be modulated at high speed can be provided.

Figure 5:
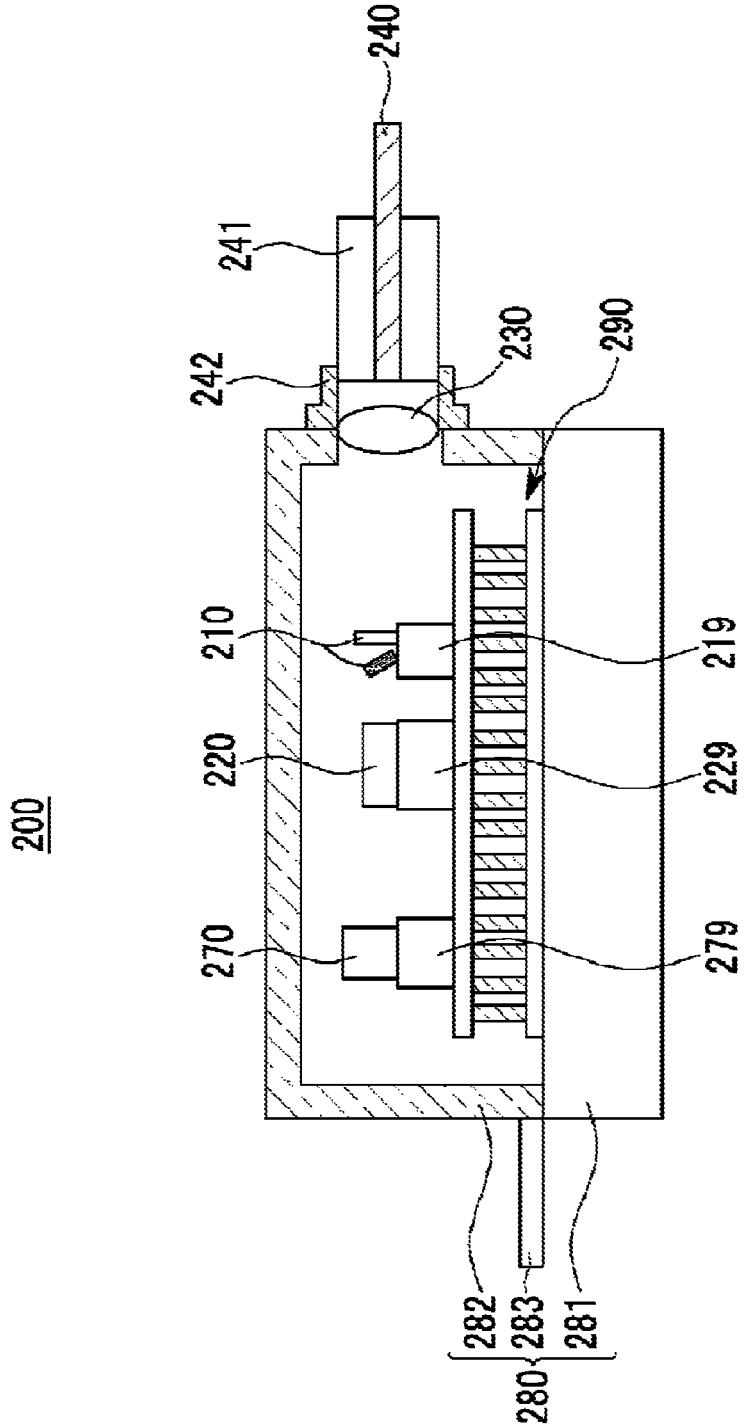
FIG. 5 shows a cross-sectional view of a wavelength tunable light source according to a second embodiment of the present invention.

Hereinafter, other embodiments of the present invention will be described with reference to FIGS. 5 to 7. Since a wavelength tunable light source according to other embodiments of the present invention has a structure similar as the wavelength tunable light source 100 according to the first embodiment, the same components of the other embodiments as the components the first embodiment will not be described.

Since a wavelength tunable light source according to other embodiments of the present invention has a structure similar as the wavelength tunable light source 100 according to the first embodiment, the same components of the other embodiments as the components the first embodiment will not be described.

The wavelength tunable light source 200 according to the embodiment horizontally outputs optical waves emitted from the optical gain medium 220 and the wavelength tunable filter 210 through the optical coupling lens 230 and the optical fiber 240 without changing directions of the emitted optical waves. Further, the housing 280 includes a base 281, a cap 282, and a lead 283. In the embodiment, the housing 280 has not the TO but a box type.

As such, the wavelength tunable light source 200 according to the second embodiment of the present invention can be more simply formed by changing the shape of the housing and simplifying the configuration.

Figure 6:
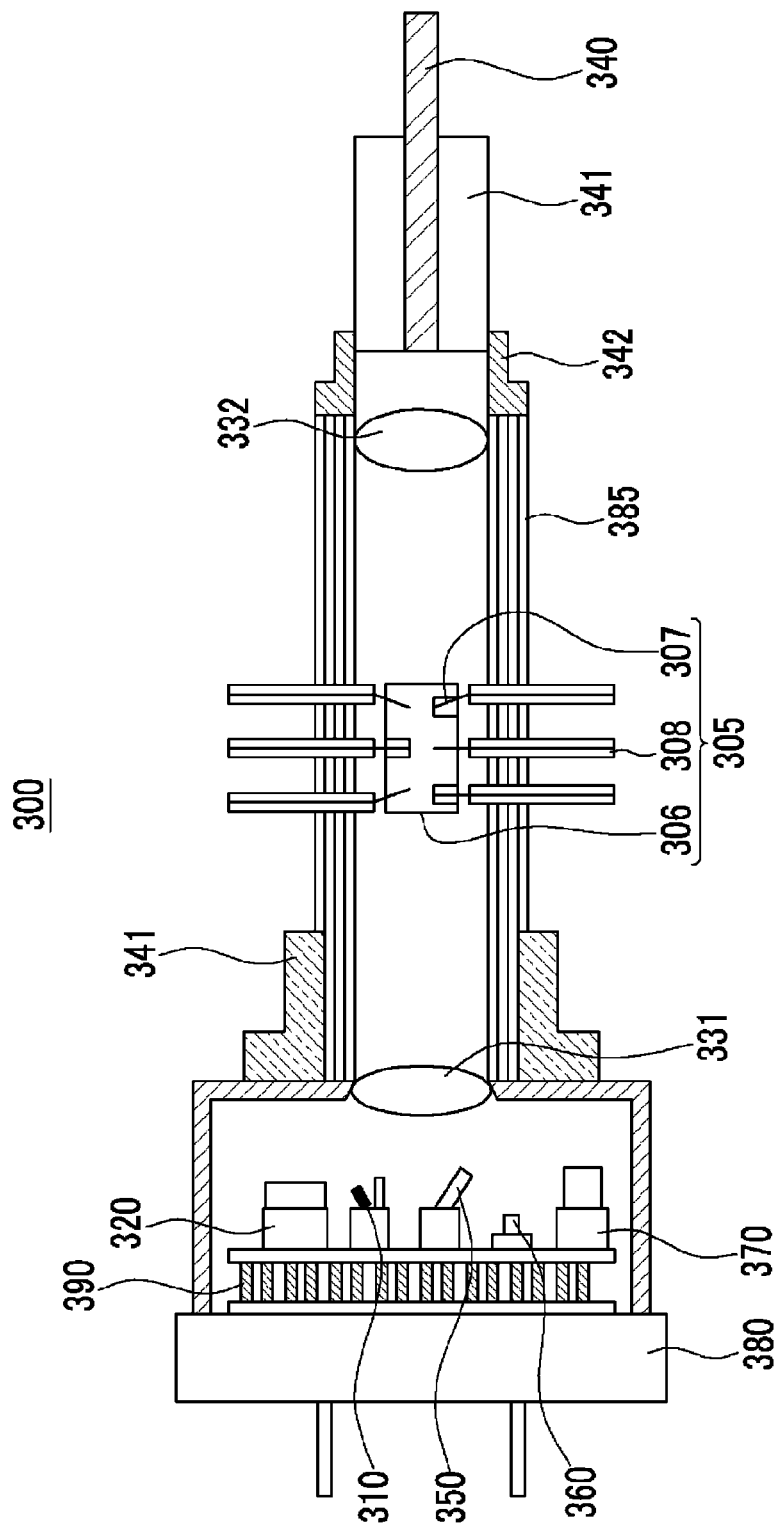
FIG. 6 shows a cross-sectional view of wavelength tunable light source according to a third embodiment of the present invention.
Figure 8A:
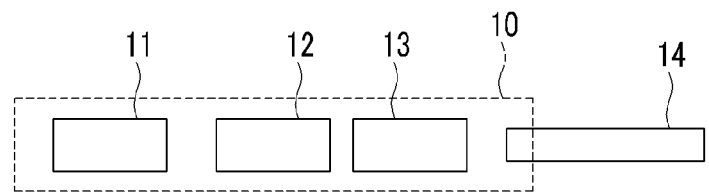
FIGS. 8A and 8B show block diagrams for each function of a wavelength tunable light source based on PLC-ECL and SG-DBR laser diode in the prior art.
Figure 8B:
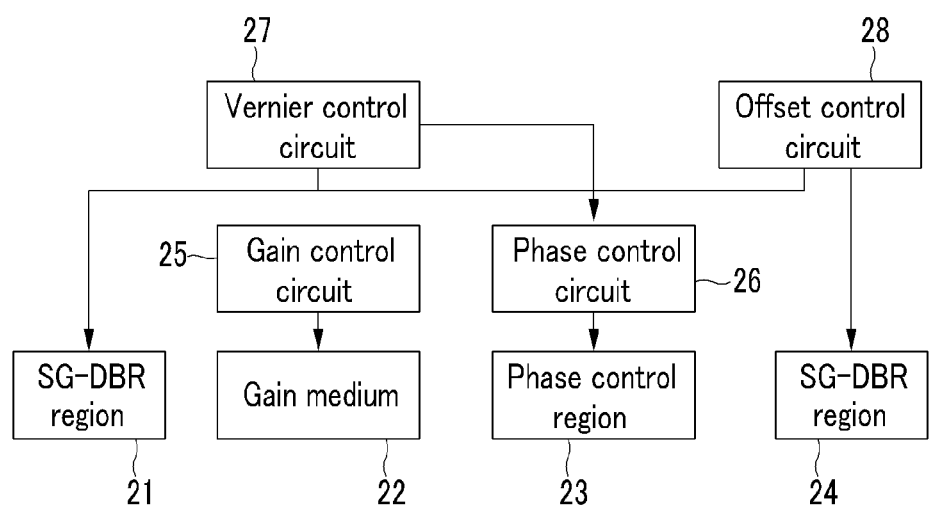

FIG. 6 shows a wavelength tunable light source according to a third embodiment of the present invention. The wavelength tunable light source 300 according to the third embodiment of the present invention further includes an external modulator 320 in addition to the wavelength tunable light source according to the first embodiment.

Referring to FIG. 6, the wavelength tunable light source 300 according to the embodiment includes, as described in the first embodiment, a TO package including a wavelength tunable filter 310, an optical gain medium 320, an optical wave distributor with a mirror 350, an optical detector 360, a thermistor 370, a thermo-electric cooler 390, and a first housing 380. An external modulator 305 is coupled with an optical fiber 340 by using optical coupling lenses 331 and 332.

The external modulator 305 includes an electroabsorption modulator 306, an electrode 307, and a lead 308 for driving the electroabsorption modulator 306. A second housing 385 for mounting the external modulator 305 is provided to bond with a TO package and a metallic optical fiber ferrule 341 through a first sleeve 342 and a second sleeve 343, respectively. At this time, each of the sleeves 342 and 343 may be bonded through laser welding by using a laser welder Meanwhile, in the third embodiment of the present invention, the second housing 385 may have a box-type package structure, a butterfly package structure, or a mini-dual-in-line (DIL) package structure.

The external modulator 305 is optically coupled with optical fiber 340 through the first optical coupling lens 331 and the second optical coupling lens 332, respectively. The aspherical lens or the ball lens may be used as the optical coupling lenses 331 and 332. As described above, a wavelength of an optical wave emitted from the TO package is tunable and the optical wave can be optically coupled with the external modulator 305 including the electroabsorption modulator 306 through the first optical coupling lens 331. Continuous optical wave output emitted from the TO package is very stable and high-speed modulation is performed by the external modulator 305. The output of the optical wave through the external modulator 305 can be coupled with the optical fiber 340 through the second optical coupling lens 332 and a wavelength of the signal emitted from the optical fiber 340 is tunable FIG. 7 shows a cross-sectional view of wavelength tunable light source according to a fourth embodiment of the present invention. The wavelength tunable light source 400 according to the fourth embodiment of the present invention further includes an external modulator 405 in addition to the wavelength tunable light source according to the first embodiment.

Referring to FIG. 7, the wavelength tunable light source 400 according to the embodiment includes a TO package including a wavelength tunable filter 410, an optical gain medium 420, an optical wave distributor with a mirror 450, an optical detector 460, a thermistor 470, a thermo-electric cooler 490, and a first housing 480 and has a structure in which the TO package is coupled with the external modulator 405 and an optical fiber 440 by using optical coupling lenses 431 and 432. The external modulator 405 is formed by integrating an electroabsorption optical modulator 406 and a reflective semiconductor optical amplifier 409 and includes an electrode 407 and a lead 408 for driving the electroabsorption modulator 406 and the reflective semiconductor optical amplifier 409. Besides, the wavelength tunable light source 400 further includes a second housing 485 for mounting the external modulator 405.

The second housing 485 is bonded with the TO package and the optical fiber through a first sleeve 442 and a second sleeve 443, respectively. At this time, each of the sleeves 442 and 443 may be bonded through laser welding by using the laser welder. Meanwhile, in the fourth embodiment of the present invention, the second housing 485 may have the box-type package structure, the butterfly package structure, or the mini-DIL package structure.

The external modulator 405 is optically coupled with the optical fiber 440 through the first optical coupling lens 431 and the second optical coupling lens 432. The aspherical lens or the ball lens may be used as the optical coupling lenses 431 and 432. At this time, the optical fiber may be fixed to the metallic optical fiber ferrule 441 by the thermally stable epoxy resin.

The wavelength tunable light source 400 according to the embodiment integrates the electroabsorption modulator 406 and the reflective semiconductor optical amplifier 409 to the external modulator 405 unlike the third embodiment. Therefore, by additionally integrating the reflective semiconductor optical amplifier 409, wavelength tuning in which a high-output optical wave of which a loss is compensated is provided is available and a light source which can be modulated at high speed can be implemented.

As described above, the wavelength tunable light source according to the embodiment of the present invention configures the wavelength tunable filter by using the dielectric thin-film filter made of a material having an excellent heat transfer characteristic to ensure wavelength tuning stability, high slope efficiency, and a low loss, thereby obtaining higher output optical power. In addition, the wavelength tunable light source can be manufactured in a small size and a manufacturing cost can be saved by simplifying a manufacturing process.

Further, the wavelength tunable light source according to the embodiment of the present invention configures the optical gain medium by integrating the reflective semiconductor optical amplifier and the electroabsorption modulator to achieve high-speed modulation characteristic. In addition, by using the external modulator like the electroabsorption modulator and semiconductor optical amplifier, the wavelength tunable light source are capable of compensating the loss of the optical wave output and performing high-speed modulation can be implemented.

While this invention has been described in connection with what is presently considered to be practical exemplary embodiments, it is to be understood that the invention is not limited to the disclosed embodiments. That is, it will be easily appreciated by those skilled in the art that various modifications and variations can be made within the spirit and scope of the appended claims.

What is claimed is:

1. A wavelength tunable light source, comprising:
   an optical gain medium for generating broadband light, the optical gain medium being made of a gain material, such that no resonance of light is created therein when the broadband light is generated;
   a wavelength tunable filter positioned on an optical path of the broadband light and transmitting or reflecting a portion of the broadband light injected thereinto that has only a predetermined wavelength;
   a first housing where the optical gain medium and the wavelength tunable filter are mounted; and
   an optical fiber for outputting the portion of the broadband light having the predetermined wavelength from the wavelength tunable filter, wherein
   the wavelength tunable filter includes a dielectric thin-film filter formed by alternately stacking a first dielectric thin film layer and a second dielectric thin film layer that have different refractive indices.

2. The wavelength tunable light source of claim 1, wherein:
   the first dielectric thin film layer and the second dielectric thin film layer have different thermooptic coefficients.

3. The wavelength tunable light source of claim 1, wherein:
   the first dielectric thin film is made of an amorphous silicon based material which is hydrogenated and the second dielectric thin film is made of a silicon nitroxide based material or a silicon nitride based material.

4. The wavelength tunable light source of claim 1, wherein:
   the wavelength tunable filter further includes a reflection plate, and
   the reflection plate reflects the optical wave transmitted through the dielectric thin-film filter from the optical gain medium.

5. The wavelength tunable light source of claim 4, wherein the dielectric thin-film filter is placed with a typical angle along the incident direction of the broadband light injected into the wavelength tunable filter.

6. The wavelength tunable light source of claim 4, wherein the reflection plate is a reflective thin film layer.

7. The wavelength tunable light source of claim 1, further comprising a lens for optical coupling that is supported by the first housing, wherein the lens is positioned on an optical path of the portion of the broadband light that is transmitted through the wavelength tunable filter or reflected from the wavelength tunable filter to the optical fiber.

8. The wavelength tunable light source of claim 1, further comprising:
   a thermistor and a thermo-electric cooler that are mounted on the first housing coincidently,
   wherein the optical gain medium, the wavelength tunable filter, and the thermistor are placed on the thermo-electric cooler.

9. The wavelength tunable light source of claim 1, further comprising:
   an optical wave distributor with a mirror mounted in the first housing and changing an direction of the portion of the broadband light having a predetermined wavelength transmitted through the wavelength tunable filter or reflected from the wavelength tunable filter; and
   an optical detector mounted in the first housing and monitoring performance of the wavelength tunable light source by detecting partial optical light refracted by the optical wave distributor with the mirror.

10. The wavelength tunable light source of claim 1, further comprising an external modulator disposed between the first housing and the optical fiber.

11. The wavelength tunable light source of claim 10, wherein:
    the external modulator includes an electroabsorption modulator.

12. The wavelength tunable light source of claim 11, wherein:
    the external modulator is formed by integrating the electroabsorption modulator and a reflective semiconductor optical amplifier.

13. The wavelength tunable light source of claim 10, further comprising:
    a second housing where the external modulator is mounted; and
    an optical fiber ferrule where the optical fiber is mounted.

14. The wavelength tunable light source of claim 13, wherein:
    the first housing is formed by a transistor outlined package and the second housing is formed by a box-type package.

15. The wavelength tunable light source of claim 10, further comprising:
    a first lens for coupling the optical gain mediumn and the wavelength tunable filter and the external modulator; and
    a second optical coupling lens for optically coupling the external modulator and the optical fiber.

16. A wavelength tunable light source, comprising:
    an optical gain medium generating broadband light;
    a wavelength tunable filter positioned on an optical path of the broadband light and transmitting or reflecting a portion of the broadband light injected thereinto that has only a predetermined wavelength;
    a first housing, the optical gain medium and the wavelength tunable filter being mounted therein; and
    an optical fiber for outputting, from the wavelength tunable filter, the portion of the broadband light having the predetermined wavelength, wherein
    the wavelength tunable filter includes a dielectric thin-film filter that has alternately stacked first and second dielectric thin film layers of different refractive indices, and
    the optical gain medium is comprised of a reflective semiconductor optical amplifier or a semiconductor laser diode, and the reflectance of a front emission surface is 0.1% or less and the reflectance of a rear emission surface is 90% or more.

17. The wavelength tunable light source of claim 16, further comprising an electroabsorption modulator for high speed modulation that is integrated with the reflective semiconductor optical amplifier or the semiconductor laser diode.

* * * * *